United States Patent
Tilly

(12)
(10) Patent No.: US 6,297,562 B1
(45) Date of Patent: Oct. 2, 2001

(54) SEMICONDUCTIVE CHIP HAVING A BOND PAD LOCATED ON AN ACTIVE DEVICE

(75) Inventor: Lars Tilly, Malmö(SE)

(73) Assignee: Telefonaktieboalget LM Ericsson (publ), Stockholm (SE)

(*) Notice: Subject to any disclaimer, the term of this patent is extended or adjusted under 35 U.S.C. 154(b) by 0 days.

(21) Appl. No.: 09/399,363

(22) Filed: Sep. 20, 1999

(51) Int. Cl.⁷ .................................................. H01L 23/48
(52) U.S. Cl. .......................... 257/780; 257/781; 257/738; 257/778
(58) Field of Search ................................. 257/777, 778, 257/780, 737, 738, 781

(56) References Cited

U.S. PATENT DOCUMENTS

| | | |
|---|---|---|
| 5,349,239 | 9/1994 | Sato . |
| 5,373,185 | 12/1994 | Sato . |
| 5,640,052 * | 6/1997 | Tsukamoto ............................ 257/781 |
| 5,669,545 | 9/1997 | Pham et al. . |
| 5,686,762 | 11/1997 | Langley . |
| 5,734,193 | 3/1998 | Bayraktaroglu et al. . |
| 5,736,790 * | 4/1998 | Iyogi et al. ............................ 257/780 |
| 5,831,337 | 11/1998 | Sato . |
| 5,869,899 * | 2/1999 | Arledge et al. ...................... 257/738 |
| 5,904,499 | 5/1999 | Pace . |
| 5,914,536 * | 6/1999 | Shizuki et al. ...................... 257/778 |
| 5,939,739 | 8/1999 | O'Keefe . |
| 5,959,363 * | 9/1999 | Yamada et al. ..................... 257/787 |
| 5,962,925 * | 10/1999 | Eifuku et al. ........................ 257/778 |
| 5,973,930 * | 10/1999 | Ikeda et al. .......................... 257/778 |
| 6,002,172 * | 12/1999 | Desai et al. .......................... 257/737 |
| 6,016,013 * | 1/2000 | Baba ..................................... 257/778 |

FOREIGN PATENT DOCUMENTS

| | | |
|---|---|---|
| 0 825 646A2 | 2/1998 | (EP) . |
| 60013848 | 4/1986 | (JP) . |
| 06201090 | 8/1996 | (JP) . |

OTHER PUBLICATIONS

H.Sato, M.Miyauchi, K.Sakuno, M.Akagi. M.Hasegawa, J.K. Twynam, K.Yamamura and T.Tomita, "Bump Heat Sink Technology—A Novel Assembly Technology Suitable For Power HBTs", Published 1993, pp. 337–340.

Keiji Yamamura, Hisashi Atarashi, Noriko Kakimoto, Naoki Sakota, Hiroya Sata, Masato Miyauchi, Katsuyuki Naito and Takashi Nukii, "Flip–Chip Bonding Technology for GaAs–MMIC Power Devices", Published 1993, pp. 433–438.

Yutaka Tsukada, Shogo Mizumoto and Yasushi Kodama, "Build–up Printed Circuit Board and Bare Chip Packaging", Published Date Unknown, pp. 1–9.

Tuomo Jaakola, Jaakko Lenkkeri and Jouko Vähäkangas, "Flip–Chip Joining Utilizing Gold Bumps", Published Oct. 9, 1997, pp. 1–9.

Panasonic, Panasert "Flip Chip Bonding System", Published 1998, pp. 1–11.

* cited by examiner

*Primary Examiner*—Eddie Lee
*Assistant Examiner*—Lourdes Cruz
(74) *Attorney, Agent, or Firm*—Burns, Doane, Swecker & Mathis, L.L.P.

(57) ABSTRACT

A semiconductive chip having at least one active device, and at least one bond pad located on said active device. The bond pad has at least one deformable member, and the deformable member is deformable when conductive stud is bonded to said bond pad so as to prevent damage to the active device during the bonding of the conductive stud to the bond pad, such as by an ultrasonic bonding technique. A plurality of the deformable members may define a pattern on the bond pad that deforms when the conductive stud is bonded to the bond pad.

15 Claims, 5 Drawing Sheets

SEMICONDUCTIVE CHIP HAVING A BOND PAD LOCATED ON AN ACTIVE DEVICE

FIELD OF THE INVENTION

The present invention pertains to semiconductive chips, and, more particularly, to bond pads of semiconductive chips.

BACKGROUND OF THE INVENTION

Conventional semiconductive chips include many active devices, i.e., transistors and diodes, as well as inactive devices, i.e., resistors and capacitors. These semiconductive chips include a plurality of bond pads, which are metallized areas on the periphery of the semiconductive chip for making a connection to a package pin. A small diameter gold or aluminum wire is bonded each of to the bond pads by application of heat and ultrasonic energy. Each of these bond wires electrically connects the semiconductive chip with a circuit or component of a substrate. In an effort to decrease the space occupied by semiconductive chips and the assembly steps associated with such semiconductive chips, flip chip solutions have become more prominent because they do not require wire bonding.

A conventional flip chip is essentially a semiconductive die with all terminations on one side of the chip in the form of solder bond pads or bump contacts. The surface of the flip chip having the bond pads is flipped over for attaching to a matching substrate in which interconnecting thin films and possibly also thin film components have previously been deposited. All electrical connections between the flip chip and the substrate are made simultaneously by applying heat or a combination of ultrasonic energy and pressure. With such conventional flip chips, the bond pads are not located on the active devices of the chip. Rather, the bond pads are intentionally located away from the active devices. See, for example, Column 4, lines 53–57 of U.S. Pat. No. 5,764,486. The bond pads are located away from the active devices because fabrication of the bond pads or attachment of contact studs to such bond pads may damage the active device if the active device is located underneath the bond pad. For example, the bonding of a contact stud (a rigid electrical conductor) to the bond pad of the flip chip may crack a transistor if the bond pad is located on the transistor, rendering the chip inoperable or significantly decreasing its reliability.

Despite the known drawbacks of locating bond pads on active devices of chips, attempts have been made to locate specially configured bond pads directly over some transistors. For example, one conventional flip chip includes a specifically configured gold bump located on a transistor cell of a chip. The gold bump is formed by depositing a 20–50 micron layer of gold on top of the transistor cell with an electroplating process. The gold bumps can then be bonded, such as soldered, to a matching substrate. However, fabrication of these gold bumps problematically requires several manufacturing steps, further complicating the construction of the flip chip.

SUMMARY OF THE INVENTION

Generally speaking, one object of the embodiments of the invention is to provide a semiconductive chip having a bond pad located on an active device of the chip, where the bond pad is configured such that a conductive stud can be bonded to the bond pad without damaging the active device.

According to one aspect of the present invention, a semiconductive chip includes at least one active device, and at least one bond pad located on the active device. The bond pad has at least one deformable member. The deformable member is deformable when a conductive stud is bonded to the bond pad.

According to another aspect of the present invention, a semiconductive chip includes at least one active device, and at least one bond pad located on the active device. The bond pad has a patterned portion that is deformable when a conductive stud is bonded to the bond pad so as to prevent damage to the active device during the bonding of the conductive stud to the bond pad.

In accordance with a further aspect of the present invention, a method includes ultrasonically bonding a conductive stud to a bond pad of a semiconductive chip. The bond pad is located on an active device of the semiconductive chip.

Another aspect of the present invention pertains to a method of deforming a deformable member of a bond pad of a semiconductive chip when bonding a conductive stud to the bond pad of the semiconductive chip. The bond pad is located on an active device of the semiconductive chip.

A further aspect of the present invention pertains to a semiconductive chip having at least one active device and at least one bond pad located on the active device. A conductive stud is ultrasonically bonded to the bond pad.

Other objects, advantages and features associated with the present invention will become readily apparent to those skilled in the art from the following detailed description. As will be realized, the invention is capable of other and different embodiments, and its several details are capable of modification in various obvious aspects, all without departing from the invention. Accordingly, the drawings and the description are to be regarded as illustrative in nature, and not limitative.

DESCRIPTION OF THE PREFERRED EMBODIMENTS

Figure 1:
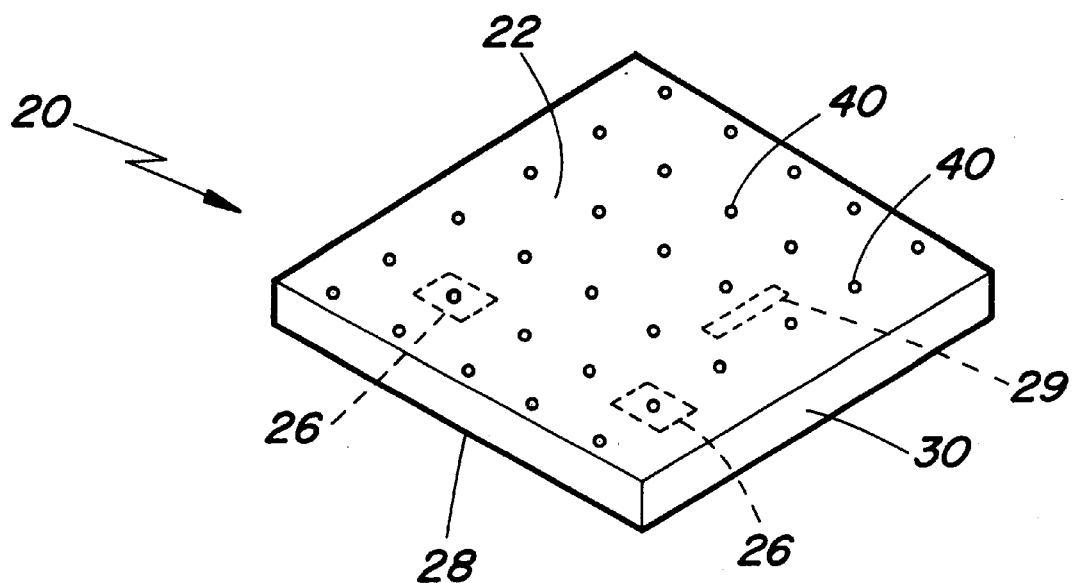
FIG. 1 illustrates a perspective view of a chip according to one embodiment of the present invention.
Figure 2:
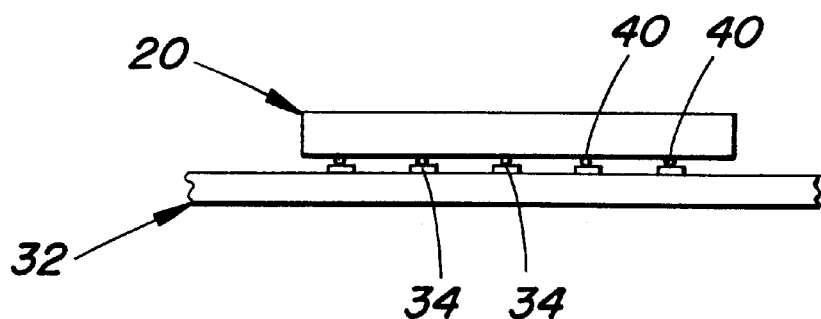
FIG. 2 illustrates a side view of the chip illustrated in FIG. 1 bonded to a substrate in accordance with one embodiment of the present invention.

In the following description, like reference numeral refer to like parts throughout the Figures.

FIGS. 1–11 illustrate features of a semiconductive chip 20 according to an embodiment of the present invention. The semiconductive chip 20 illustrated in FIGS. 1–11 includes a bond pad 24 located on an active device 26 of the chip. The bond pad 24 includes at least one deformable member 36 that deforms when a conductive stud 40 is bonded to the bond pad so as to prevent damage to the active device 26 during the bonding process. Because the conductive stud 40 may be bonded to the bond pad 24 without impairing the function of the active device 26, the inductance associated with electrical paths between the chip and a substrate 32 is decreased and a direct heat dissipation path is provided for heat generated by the active device.

The chip 20 is generally an unpackaged semiconductive device cut from a wafer, typically an integrated circuit, although the chip 20 may be packaged in accordance with known techniques and still function as contemplated herein. The semiconductive chip 20 illustrated in FIG. 1 is preferably a flip chip, which is essentially a semi-conductor die having terminations located on one surface 22 of the chip 20 in the form of bump contacts or bond pads 24 (see FIGS. 3–11). After the surface 22 of the chip has been passivated or otherwise treated, it is typically flipped over for attaching to a matching substrate 32 having thin film metal contacts 34 located at positions that correspond to the location of the conductive studs 40 of the chip 20 (see FIG. 2).

The substrate 32 includes interconnected thin films and possibly also thin-film components that have been previously deposited. All or some of the connections are made between the chip 20 and the substrate 32 by bonding the conductive studs 40 to the contacts 34 of the substrate 32. The bonding between the conductive studs 40 and the contacts 34 of the substrate 32 may be achieved by soldering, cementing, chemical adhesives, by applying heat, a combination of ultrasonic energy and pressure, any combination of the previous, or other conventional bonding techniques. Hence, many different bonding methods may be used to bond the conductive stud 40 of the chip 20 to the contacts 34 of the substrate 32. For example, metal alloys (eutectic die attaches, solders, silver-filled glasses), and organic adhesives (polyamides, silicones, and epoxies) may be used to form the bond between the conductive stud 40 and the contacts 34. If the conductive studs 40 are formed from gold, a gold-silicon (Au—Si) bond may be used to bond the gold studs 40 to the contacts 34. The silicon defuses into the gold until the Au—Si eutectic composition is reached. Bonding with soft solder (95% lead, 5% tin) is also a low-temperature alternative.

Although the preferred embodiment of the chip 20 is a flip chip, other chips are also contemplated. For example, the chip 20 may have bond pads 24 on both the bottom surface 22 and the opposing top surface 28 of the chip. Hence, the chip 20 can be a chip that is used in a multi-module unit having a plurality of chips 20 stacked on top of each other. The bond pads 24 also need not be arranged in any ordered pattern.

The chip 20 preferably includes many active devices 26, only a few of which are illustrated schematically in FIG. 1.

Active devices 26 include components capable of controlling voltages or currents to produce gain or a switching action in a circuit. Examples include transistors, such as heterojunction bipolar transistors (HBT) structures and field-effect transistors (FET's). The chip 20 also preferably includes many passive devices 29, such as resistors, capacitors, and inductors. Together, the active devices 26 and passive devices 29 function as an integrated circuit. However, the chip 20 can also be a die for a single discrete device, such as a diode, transistor, or power transistor.

Figure 3:
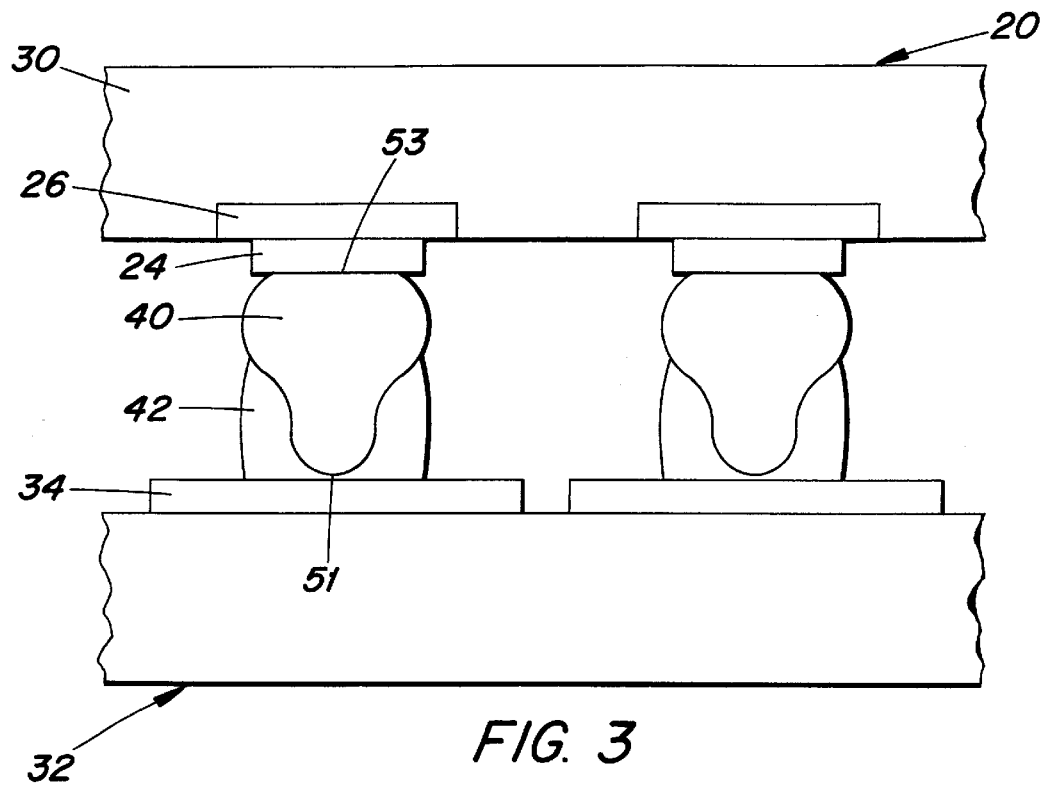
FIG. 3 illustrates an enlarged partial side view of the chip illustrated in FIG. 1 bonded to a substrate.

FIG. 3 illustrates an enlarged and partial view of the chip 20 bonded to the substrate 32. The substrate 32 may be a wafer of silicon or gallium arsenide or other semiconductive materials on which active and passive components are formed. The substrate 32 may also be ceramic, such as an alumina wafer on which conductive paths are formed and include resistors, capacitors, and other items as well. The substrate 32 can also be a circuit board on which a plurality of the chips 20 may be bonded to, typically made of glass-fiber epoxy laminate (GFE).

As illustrated in FIG. 3, a conductive stud 40 is bonded to each of the bond pads 24 of the chip 20. The conductive stud 40 is essentially a protruding pin, peg, bump, or other like member formed of a conductive material. The bond pad 24 is essentially a metallized area (approximately 100×100 $\mu$m) on at least one side 22 of the flip chip 20. When the conductive studs 40 are bonded the bond pads 24, an electrical connection is established between the bond pad and the conductive stud. Hence, when the conductive studs 40 are bonded to the contacts 34 of the substrate 32, an electrical connection is established between the bond pads 24 and the contacts 34. In the preferred embodiment, each bond pad 24 is not only located on the active device 26, but also defines an electrical connection with the active component, which thus lessens the inductance associated with the conductive path between the active device and the substrate circuits or components. For example, if the active device is a transistor, the bond pad 24 can be electrically connected to the base, collector, or emitter of a transistor (see FIG. 10).

Figure 8:
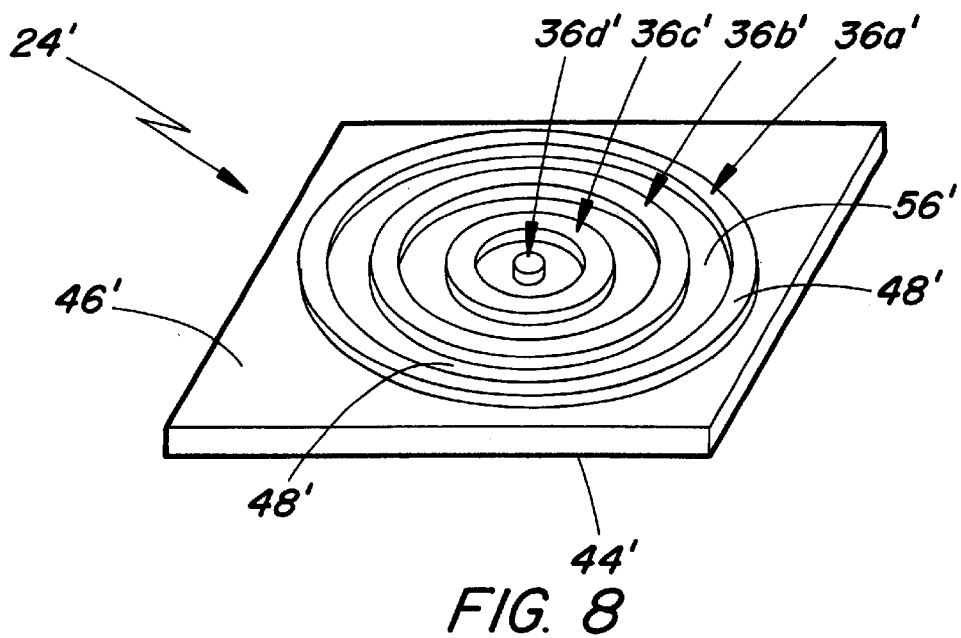
FIG. 8 illustrates an alternative embodiment of a bond pad of a chip according to one embodiment of the present invention.
Figure 9:
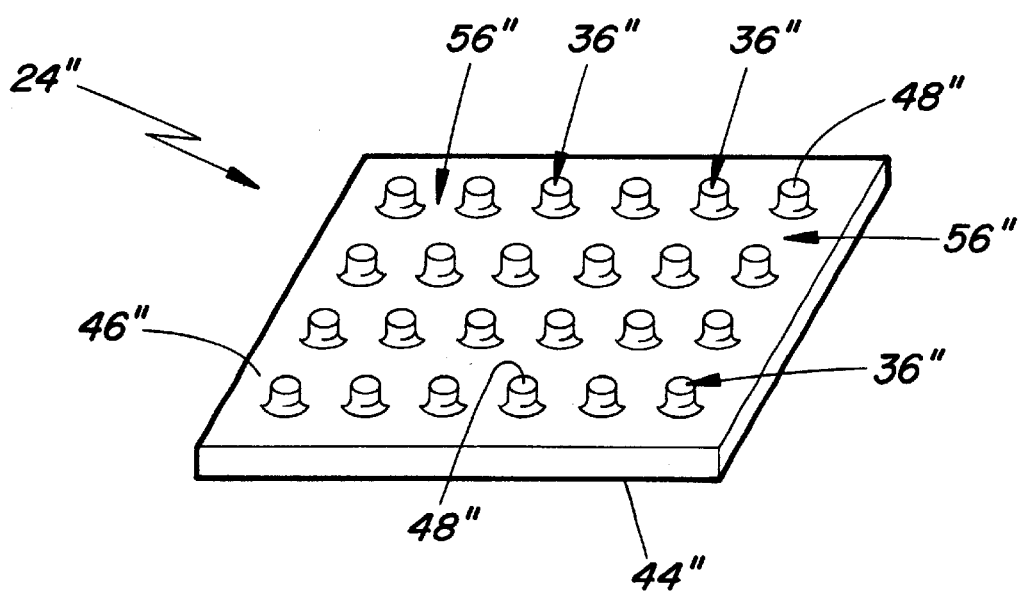
FIG. 9 illustrates a further embodiment of a bond pad of a chip according to one embodiment of the present invention.
Figure 10:
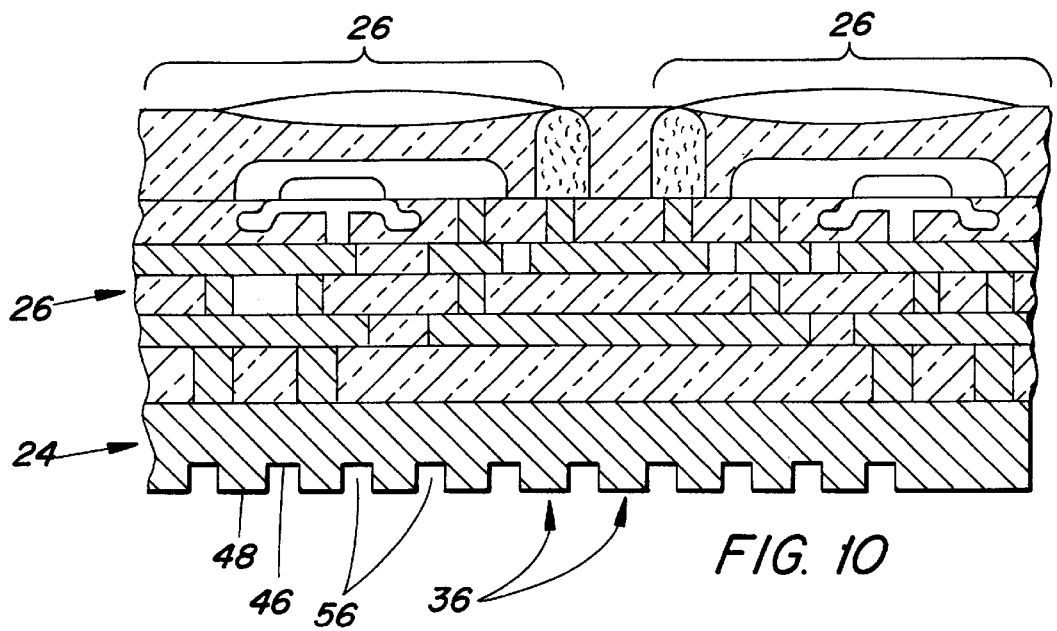
FIG. 10 illustrates a partial and enlarged cross-sectional view of the chip illustrated in FIG. 1 before a conductive stud has been bonded to the bond pad of the chip.
Figure 11:
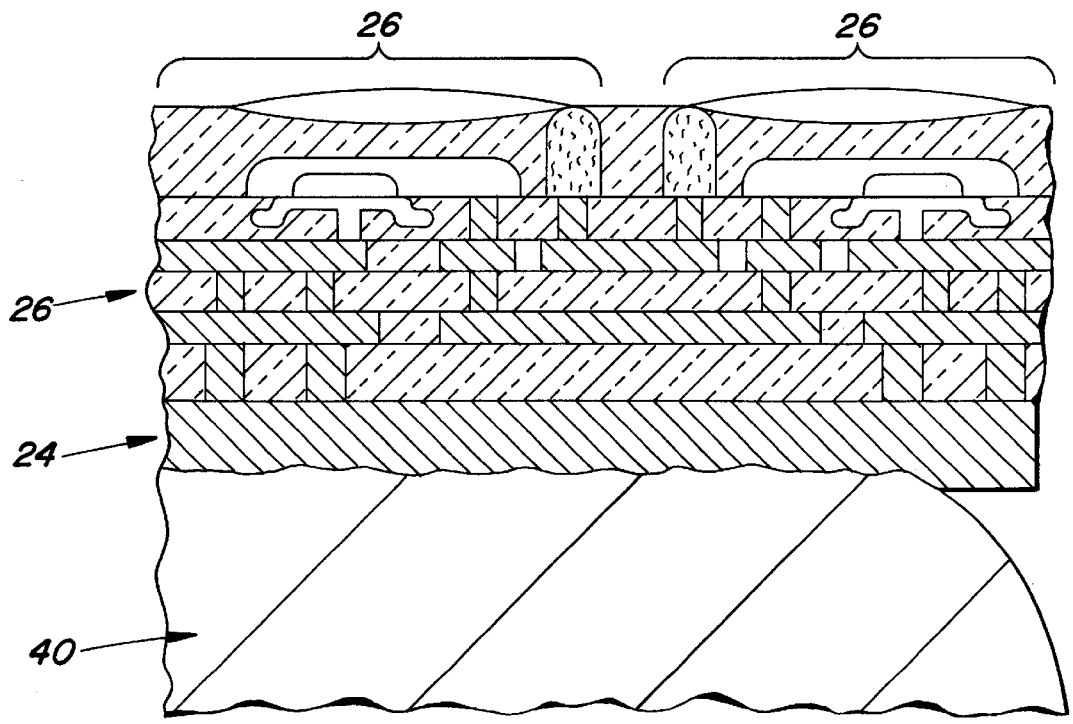
FIG. 11 illustrates a partial and enlarged cross-sectional view of the chip illustrated in FIG. 1 after a conductive stud has been bonded to the bond pad of the chip.

As illustrated in FIGS. 3–11, at least some of the bond pads 24 are located on the active devices 26 of the chip 20. That is, at least one bond pad 24 extends over the area of an active device 26. Hence, a bond pad 24 is located in overlapping arrangement with the area of at least one active device 26 of the chip 20. In the embodiment illustrated in FIGS. 10 and 11, the bond pad 24 is on two active devices 26 and is in electrical contact with a contact of both active devices. The bond pad 24 may not actually contact the material that defines the active device 26, but will still be "on" the active device as it overlaps the area of the active device. Because one conductive stud 40 is bonded to one bond pad 24, the conductive stud will also overlap the area of the active device 26. Hence, the conductive stud 40 is also located on the active device 26, even though one or more items such as the bond pad 24 are located between the conducive stud 40 and the active device 26. Thus, at least some of the conductive studs 40 are located on the active devices 26 of the flip chip 20. Although not illustrated, other bond pads can be located away from the active devices 26. That is, all of the bond pads 24 of the chip 20 do not have to be located on active devices 26. Although FIGS. 1, and 3–5 illustrate a single bond pad 24 as having a smaller area than the area of a single active device 26 (as measured along an axis parallel with the longitudinal axis of the chip 20), in most instances a single bond pad will occupy an area that is larger than that of any single active device, such as illustrated in FIGS. 10 and 11. Hence, the bond pad 24 will typically completely overlap or cover at least one active device 26.

As described above, the conductive stud 40 may be bonded to the substrate 32 by any variety of methods. In the embodiment illustrated in FIG. 3, the conductive studs 40 are each bonded to one contact 34 with solder 42. Because the bond pad 24 and thus the conductive stud 40 are located on the active device 26 of the flip chip 20, heat generated by the active device 26 will be dispersed through the bond pad 24, conducive stud 40, solder 42, and contact 34 to the substrate 32. With this arrangement, heat generated by the active device 26 is drawn off the active device directly through the conductive stud 40 formed on the active component 26. This benefit is important with some applications because the performance of high power chips may be affected by the temperature of the chip. It is thus important to dissipate the heat generated by the transistors in such chips so as to increase the performance and reliability of the chip. For example, it is particularly desirable to dissipate heat when the chip is a high power monolithic microwave integrated circuit flip chip. Increasing the power density of chips is becoming more prevalent in the communications industry where space and weight constraints, such as that associated with high performance mobile communication tools (i.e., mobile telephones), dictate design considerations. By locating the conductive studs 40, and bond pad 24 directly over one or more active device 26 (such as HBT's or FET's) of the chip 20, heat generated by the active device may be drawn directly through the contact stud 40 to the substrate 32 where it dissipates. In the preferred embodiment illustrated in FIG. 11, the bond pad 24 and the conductive stud 40 are on two active devices 26. As shown in FIGS. 10 and 11, the bond pad 24 is also in electrical contact with an emitter electrode of a transistor unit cell. Hence, the bond pad 24 and the conductive stud 40 function as: (1) a low inductance electrical path between the active devices 26 and the substrate 32; and (2) a thermal dissipation path for heat generated by the active devices 26.

The preferred material for the conductive stud 40 is gold, which has excellent thermal and electrical conductivity as compared with other metallic materials. However, other thermally and electrically conductive materials will also suffice for the conductive studs 40, such as aluminum, tin, silver, copper, and other conductive materials.

As described earlier, it has heretofore been discouraged to locate conductive bumps directly on bond pads located on active silicon circuitry. This is understood to be because the mechanical attachment of the conductive bump to the bond pad, such as by an ultrasonic bonding process, will crack the active component of the chip, rendering the chip inoperable or unreliable. However, with the chip 20, the bond pad 24 is configured such that the active device 26 will not be damaged (i.e., rendered inoperable) when a conductive stud 40 is bonded to the bond pad. This is because the bond pad 24 includes, as illustrated in FIG. 6, at least one deformable member 36, preferably a plurality of deformable members 36 formed in a pattern, that deform to absorb mechanical energy during the bonding of the conductive stud 40 to the bond pad 24.

For example, the conductive studs 40 are preferably formed with conventional ultrasonic wire bonding equipment known to those skilled in the art. Forming the conductive studs 40 with conventional ultrasonic wire bonding equipment is a simple process where the conductive studs 40 are sequentially bonded to the bond pads 24 of the heated chip 20. Essentially, the conductive stud 40 is made by cutting a conductive wire after or when the wire has been bonded to the bond pad 24. Ultrasonic bonding refers to the bonding of two identical or dissimilar metals by mechanical pressure combined with a wiping motion produced by ultrasonic vibration. An ultrasonic bond will provide a strong in intermolecular bond between the conductive stud 40 and the bond pad 24. In this manner, the conductive studs 40 may be attached to the bond pads 24 of the chip 20. Examples of ultrasonically bonded contact studs 40 that are suitable for the present invention are described in "Flip-Chip Joining Utilizing Gold Stud Bumps" by Tuomo Jaakko, et al., VTT Electronics (Sep. 10, 1997) and "Build-up Printed Circuit Board and Bare Chip Packaging" by Yutaka Tsukada, Shogo Mizumoto and Yasushi Kodama, Yashu Technology Application Laboratory, IBM Japan, the entire disclosures of which are hereby incorporated by reference. With this approach to forming the conductive studs 40, a conventional thermosonic wire bonder and 25 $\mu$m Au PD1 wire are used to form and bond gold conductive studs 40 to the bond pads 24. The conductive studs 40 formed by this technique will have essentially a tear drop shape with flat and opposing ends 51, 53 as illustrated in FIG. 3. While this technique for bonding is simple and reliable, it imparts force on the bond pads 24. Nevertheless, with the chip 20, this force will be absorbed by the bond pads 24 to such an extent that the active device will not be damaged.

Figure 6:
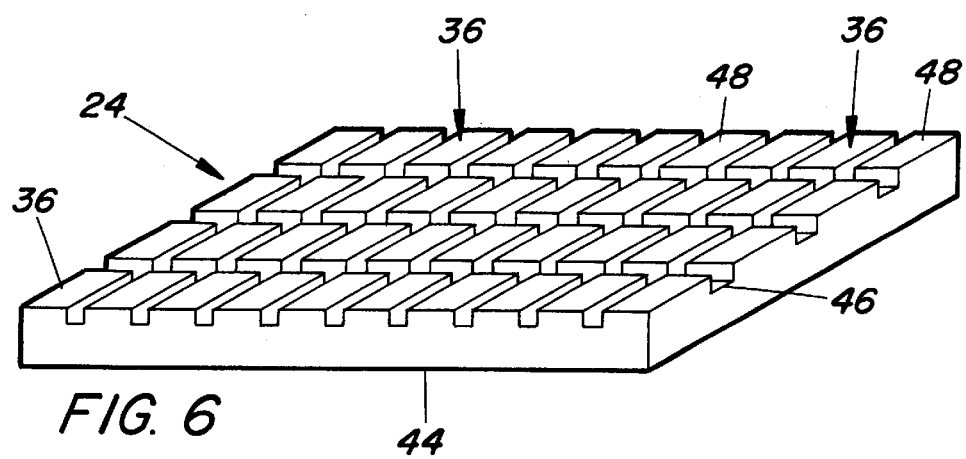
FIG. 6 illustrates a perspective view of bond pad of the chip illustrated in FIG. 1.

FIGS. 6–9 illustrate embodiments of bond pads 24, 24', 24" of the chip 20 according to an embodiment of the present invention. As illustrated in FIG. 6, the bond pad 24 includes a plurality of deformable members 36. The deformable members 36 are essentially protrusions extending from an intermediate or base surface 46 of the bond pad 24. The intermediate surface 46 of the bond pad 24 is located between a top surface 48 of the deformable members 36 and the bottom surface 44 of the bond pad 24. The intermediate surface 46 is a surface that is parallel to the bottom surface 44 of the bond pad. However, the intermediate surface 46 can be angle with respect to the base surface and/or define curved recesses, etc. Each deformable member 36 includes a top surface 48 faces in a direction toward the substrate 32 when the chip 20 is bonded to the substrate 32. The surfaces 48 of the deformable members 36 are also parallel with the bottom surface 44 and the intermediate surface 46 of one bond pad 24. Additionally, the surfaces 48 of all the deformable members 36 are preferably all spaced the same distance from the intermediate surface 46. That is, the surfaces 48 of the deformable members 36 are preferably located in a common plane.

Furthermore, the deformable members 36 are also spaced from each other by a gap 56. In the embodiment illustrated in FIGS. 6 and 7, the deformable members 36 are rectangular column-like or monument-like structures extending in a direction away from the base surface 46, preferably in a direction perpendicular to the intermediate surface 46. The deformable members 36 essentially extend away from the base surface 36 to define a physical element or item that protrudes from the intermediate surface 46. In the embodiment illustrated in FIG. 6, the bond pad 24 includes deformable members 36 throughout the area of the intermediate surface 46. Each deformable member preferably has a height 58 between 1–4 $\mu$m. The top surface 48 of each deformable member 36 is rectangular and includes sides measuring between 1–20 $\mu$m, preferably 10–15 $\mu$m by 10–15 $\mu$m.

Because the deformable members 36 protrude from the base surface 46 and are spaced from each other by the gaps 56, each deformable member is surrounded by an area into which it can deform when one of the conductive studs 40 is bonded to the bond pad 24. In the embodiment illustrated in FIG. 6, the deformable members 36 define an intentionally configured pattern on the bond pad 24. Hence, the bond pad 24 includes a deformable pattern defined by the plurality of deformable members 36. In the embodiment illustrated in FIG. 6, the deformable pattern is a criss-cross pattern, defining a waffle-like surface on the bond pad 24. Hence, the pattern on the bond pad 24 is symmetrical configured about a line passing through a mid point of the rectangular surface 48.

Figure 7:
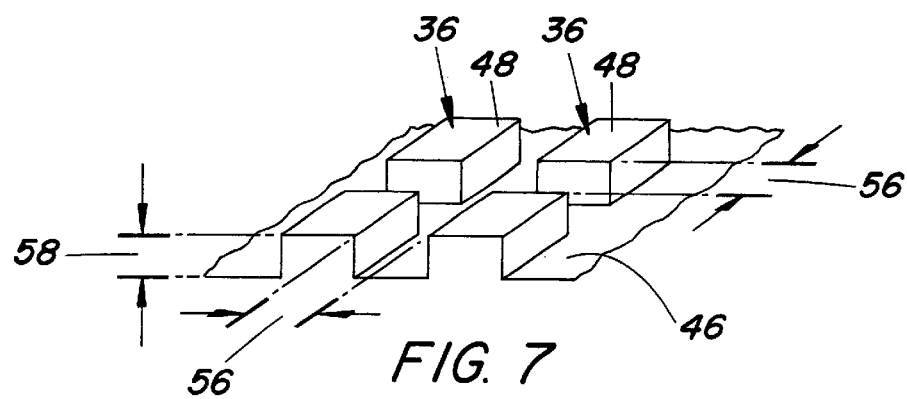
FIG. 7 illustrates an enlarged view of deformable members of the bond pad illustrated in FIG. 6.

FIGS. 8 and 9 illustrate alternative embodiments of the bond pad 24. Features of the bond pads illustrated in FIG. 8 and 9 that are similar to those of the bond pad illustrated in FIG. 7 are indicated by like reference numerals with a single prime (') or double prime (") designation. As illustrated in FIG. 8, the deformable members 36a', 36b', 36c', 36d' are concentric and circular bands each spaced from each other by a gap 56'. Hence, the deformable members 36a', 36b', 36c', 36d' define a symmetrical pattern of concentric circular bands. The deformable members 36a', 36b', 36c', 36d' are spaced from the surface 46' of the bond pad 24', like the deformable members 36 of the embodiment illustrated in FIGS. 6 and 7. Because the deformable members 36a', 36b', 36c', 36d' protrude from the bottom surface 46' and are spaced from each other by the gaps 56', each deforming member is surrounded by an area into which it can deform when one of the conductive studs 40 is bonded to the bond pad 24'. The gaps 56' defines areas in which the members 36a', 36b', 36c', 36d' may deform when the conductive stud 40 is bonded to the bond pad 24.

FIG. 9 illustrates another embodiment of a bond pad 24". The bond pad 24" includes a plurality of deformable members 36" in the shape of circular columns or cylinders extending away from the surface 46" of the bond pad 24". The cylindrical studs 36" are equally spaced about the base surface 46" of the bond pad 24" and are symmetrically arranged on the surface 46" of the bond pad 24" so as to define a plurality of rows and columns on the bond pad 24". Because the deformable members 36" protrude from the bottom surface 46" and are spaced from each other by a gap 56", each deformable member is surrounded by an area into which it can deform when one of the conductive studs 40 is bonded to the bond pad 24.

The deformable members 36 can also take other forms and define intentionally configured patterns different than those illustrated in FIGS. 6–9 and still be within the confines of the present invention. For example, the deformable members 36 may be a plurality of equal height cones or pin-like members arranged in a predetermined pattern.

The deformable members 36 and the pattern defined by the deformable members 36 can be formed by any number of known processes. For example, a metal layer can be deposited over one or more chips while part of a common wafer, or individually, by a vapor deposition process (PVD or CVD). Thereafter, the metal layer, such as a layer of Aluminum formed by sputtering, can be subjected to any number of known photolithography and etching processes to define bond pads 24 having deformable members 36 arranged in any variety of intentionally configured patterns, such as those illustrated in FIGS. 6–9.

Because the bond pads 24 of the flip chip 20 include a plurality of deformable members 36, preferably formed in a pattern, the bond pads 24 can each deform when a contact stud 40 is bonded to the bond pad 24, such as by the previously described ultrasonic bonding technique. This deformation of the bond pad 24 prevents the force associated with the bonding of the conductive stud from damaging the active device 26. As discussed earlier, it was conventionally thought to not include bond pads 24 on active components of semiconductive chips because the bonding of conductive bumps to such bond pads may damage the active component underneath the bond pad. However, with the bond pads 24 of the embodiments of the present invention, a conductive stud may be ultrasonically bonded to the bond pad without causing damage to the active components underneath the bond pad. This is because the deformable members 36 of the bond pad 24 permit sufficient deformation of the bond pad during the bonding process of the conductive stud 40 to the bond pad.

FIGS. 10 and 11 illustrate an example of a conductive stud 40 that has been bonded to a bond pad 24 of a chip 20 according to one embodiment of the present invention. FIG. 10 illustrates the configuration of the bond pad 24 and deformable members 36 before the conductive stud 40 has been bonded to the bond pad, while FIG. 11 illustrates the configuration of the bond pad and deformable members after the conductive stud has been bonded to the bond pad, such as by an ultrasonic bonding technique.

As illustrated in FIG. 10, the bond pad 24 is located on two active components 26, which are illustrated as transistors. The bond pad 24 includes the plurality of the deformable members 36 arranged in a pattern and having a plurality of gaps 56 located there between. Because the deformable members 36 protrude from the base surface 46 of the bond pad 24 and are spaced from each other by a gap 56, when the conductive stud 40 is bonded to the bond pad 24 via an ultrasonic bonding process or another mechanical bonding process, the deformable members 36 are forced toward the active device 26 and thus deform into the gaps 56. Hence, the bond pad 24 absorbs the mechanical deformation during the bonding of the conductive stud 40 to the bond pad 24 so as to prevent the active component 26 underneath the bond pad 24 from being damaged. As illustrated in FIG. 11, at least a portion of the deformable members 36 have been forced into the gaps 56 between the deformable members and have thus absorbed the mechanical energy created during the bonding of the conductive stud to the bond pad 24.

Because the deformable members deform when the conductive stud is bonded to the bond pad 24, the deformable members are preferably formed of a material that is ductile enough to deform under such conditions. Example of such materials for the deformable members include: gold, aluminum, and copper.

By bonding the conductive stud 40 to the bond pad 24 on the active component 26, the connection to the substrate 32 can then be achieved by the low temperature solder 42 on the conductive studs 40. With this electrical and mechanical connection, the conductive path through the low thermal conductive solder material will be minimized, in the order of 10 $\mu$m. Because the bond pad 24 includes the deformable members 36, the bond pad includes a deformation zone where excessive mechanical energy from the bonding process can be absorbed, without causing damage to the active device 26 located underneath the bond pad 24. Hence, with the embodiments of the present invention, a low inductive connection to the substrate 32 is achieved, which is important for high frequency applications such as those experienced in the telecommunications industry. This connection also provides a high thermal conductive path provided by the conductive studs 40, directly from the active device 26 to the substrate 32. With the preferred material of gold for the conductive studs 40, a thermal conductivity of approximately 650 W/mK may be achieved. This permits higher power densities and power dissipation to be achieved with the embodiments of the present invention.

Figure 4:
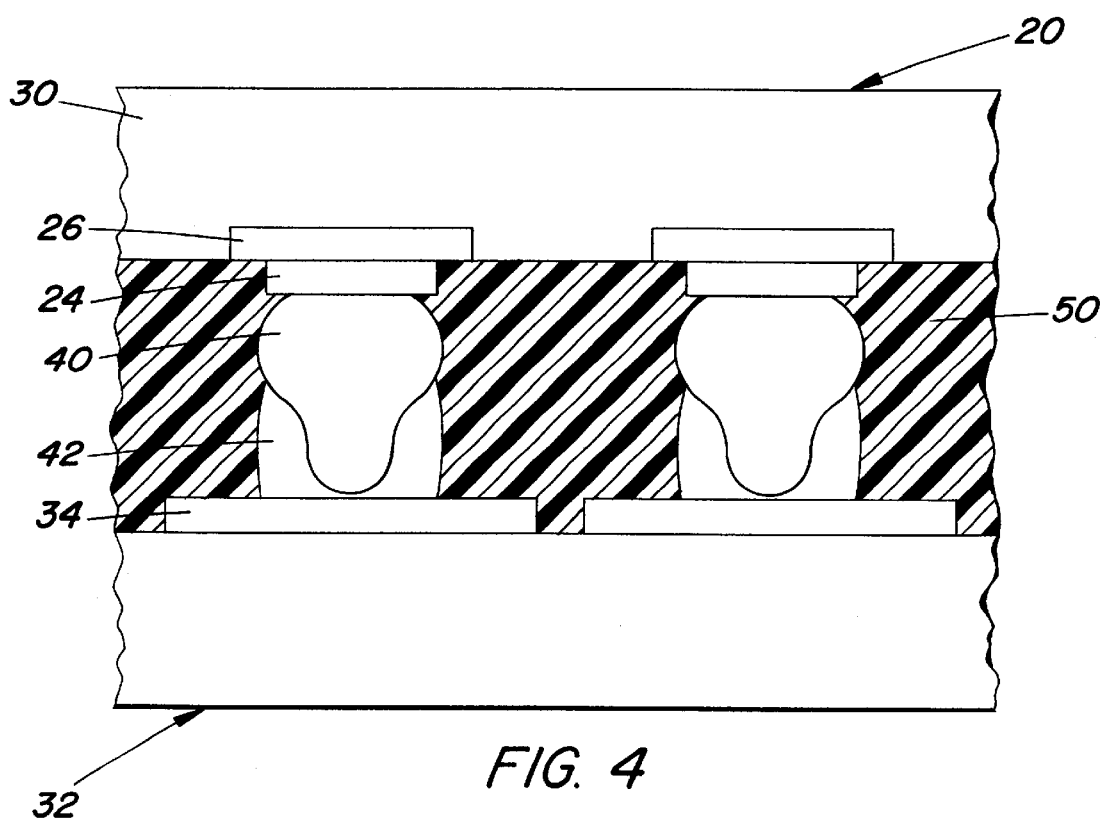
FIG. 4 illustrates an enlarged partial view of the chip illustrated in FIG. 1 bonded to a substrate with a conductive filler material disposed therebetween.

FIG. 4 illustrates the chip 20 bonded to the substrate 32, similar to that illustrated in FIG. 3, except a dielectric and thermally conductive filler 50 is located between the chip 20 and the substrate 32. Because the filler 50 is dielectric and thermally conductive, it provides an additional path through which the heat from the active device 26 can dissipate. Suitable conductive fillers 50 include epoxy resins, such as those having silver particles dispersed therein. Other examples of conductive fillers 50 that are suitable for the embodiments of the present invention include: ABLEBOND 8177 and THERMAXX 2600K, commercially available from Ablestick Laboratories, National Starch & Chemical, USA. In a preferred embodiment, the conductive filler 50 has an electrical conductivity of approximately 0.00008 Ohm-cm, and a thermal conductivity of approximately 3–20 W/mk.

Figure 5:
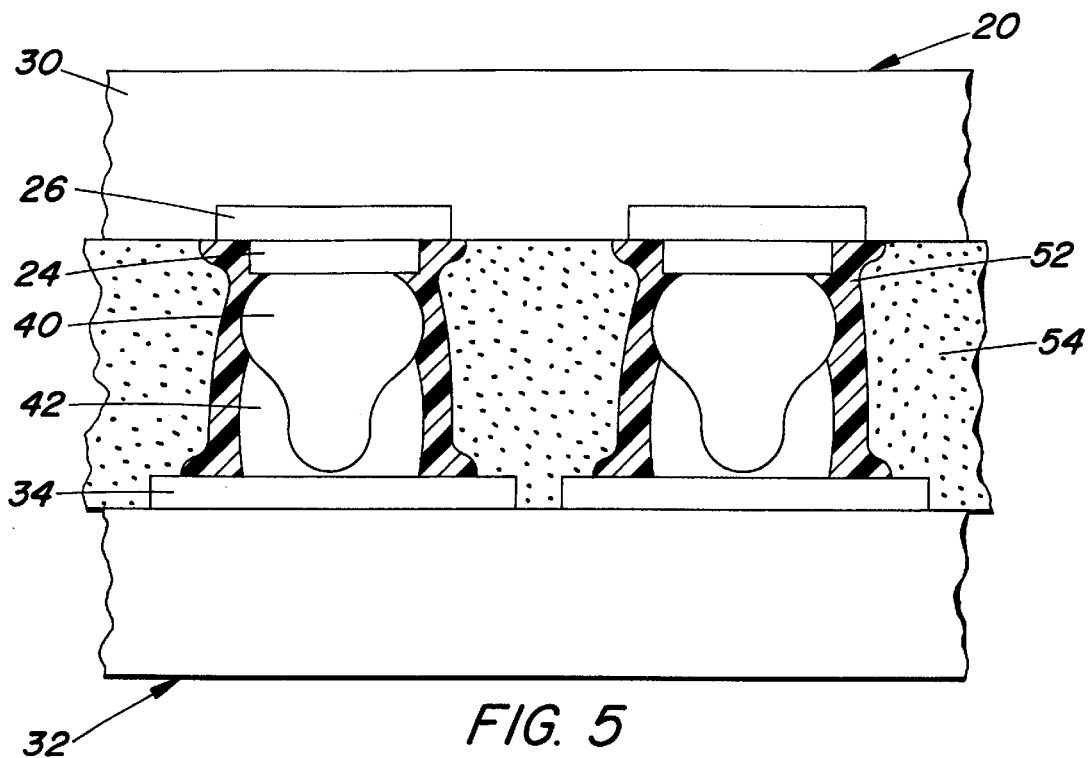
FIG. 5 illustrates an enlarged partial view of the chip illustrated in FIG. 1 bonded to a substrate with a dielectric coating disposed over the electrical connection between the chip and the substrate. A thermally conductive filler is also located between the chip and the substrate.

FIG. 5 also illustrates the chip 20 bonded to the substrate 32. The conductive studs 40, bond pads 24, and contacts 34 have been coated with a dielectric material 52, such as epoxy resin. Thereafter, a thermally conductive, as well as electrically conductive, filler 54 is located between the chip 20 and the substrate 32. Because the electrical connection between the chip 20 and the substrate 32 has been coated with the dielectric material 52, an electrically conductive filler 54 having excellent thermal conductivity characteristics may be located between the chip 20 and the substrate 32 without shorting any electrical connections between the chip 20 and the substrate 32.

The principles, preferred embodiments and modes of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims be embraced thereby.

What is claimed is:

1. A semiconductive chip comprising:
   at least one active device; and
   at least one bond pad located on said active device, said bond pad having a patterned portion that is deformable when a conductive stud is bonded to said bond pad so as to prevent damage to said active device during the bonding of said conductive stud to said bond pad, wherein said deformable member comprises a plurality of deformable members, said plurality of deformable members defining a pattern.

2. The semiconductive chip of claim 1, wherein said pattern is an etched pattern.

3. The semiconductive chip of claim 1, wherein said bond pattern is symmetrical about a line extending across a midpoint of said bond pad.

4. The semiconductive chip of claim 1, further comprising a conductive stud bonded by an ultrasonic bond to said bond pad so as to deform said deformable member.

5. The semiconductive chip of claim 1, wherein said active device includes at least one transistor.

6. The semiconductive chip of claim 4, in combination with a substrate, said conductive stud being bonded to said substrate.

7. The semiconductive chip of claim 6, further comprising a heat conductive material located between said semiconductive chip and said substrate.

8. The semiconductive chip of claim 7, further comprising a dielectric film coating said conductive stud, said heat conductive material being an electrically conductive material.

9. The semiconductive chip of claim 7, wherein said heat conductive material is a dielectric material.

10. The semiconductive chip of claim 1, wherein the deformable member includes a most distal surface raised from an intermediate surface of the bond pad.

11. A semiconductive chip comprising:
    at least one active device; and
    at least one bond pad located on said active device, said bond pad having a patterned portion that is deformiable when a conductive stud is bonded to said bond pad so as to prevent damage to said active device during the bonding of said conductive stud to said bond pad, wherein said deformable member is one of a plurality of deformable members, said deformable members each protruding from a common surface of said bond pad a same distance.

12. A semiconductive chip comprising:
    at least one active device; and
    at least one bond pad located on said active device, said bond pad having a patterned portion that is deformable when a conductive stud is bonded to said bond pad so as to prevent damage to said active device during the bonding of said conductive stud to said bond pad, wherein said patterned portion includes a plurality of deformable members each protruding from a surface of said bond pad and being spaced from each other by a gap.

13. A semiconductive chip comprising.
    at least one active device; and
    at least one bond pad located on said active device, said bond pad having a patterned portion that is deformable when a conductive stud is bonded to said bond pad so as to prevent damage to said active device during the bonding of said conductive stud to said bond pad, wherein said patterned portion includes a criss-cross pattern defined by a plurality of deformable members.

14. The semiconductive chip of claim 12, further comprising the conductive stud, said conductive stud being a gold stud bonded to said bond pad by an ultrasonic bond.

15. The semiconductive chip of claim 13, further comprising the conductive stud, said conductive stud being a gold stud bonded to said bond pad by an ultrasonic bond.

* * * * *